US012684821B2

(12) United States Patent
Cho et al.

(10) Patent No.: US 12,684,821 B2
(45) Date of Patent: Jul. 14, 2026

(54) TRANSISTOR, AND DISPLAY APPARATUS COMPRISING THE SAME

(71) Applicant: LG Display Co., Ltd., Seoul (KR)

(72) Inventors: HyunCheol Cho, Paju-si (KR); JeeHo Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 363 days.

(21) Appl. No.: 18/242,987

(22) Filed: Sep. 6, 2023

(65) Prior Publication Data

US 2024/0204110 A1 Jun. 20, 2024

(30) Foreign Application Priority Data

Dec. 19, 2022 (KR) ........................ 10-2022-0178039

(51) Int. Cl.
*H10D 30/67* (2025.01)
*H10K 59/12* (2023.01)
(52) U.S. Cl.
CPC ..... *H10D 30/6757* (2025.01); *H10D 30/6755* (2025.01); *H10K 59/12* (2023.02)
(58) Field of Classification Search
CPC ........................ H10D 30/6757; H10D 30/6755
See application file for complete search history.

(56) References Cited

U.S. PATENT DOCUMENTS

2021/0135144 A1* 5/2021 Zhang .................. H10D 86/427
2021/0202754 A1 7/2021 Jang et al.
2022/0005838 A1* 1/2022 Yamanaka ......... H10D 30/6755
2022/0005839 A1* 1/2022 Daitoh ................ H10D 86/423
2022/0157997 A1* 5/2022 Lee .................... H01L 21/02554
2022/0199829 A1* 6/2022 Kim ..................... H10D 86/423

FOREIGN PATENT DOCUMENTS

KR 10-2021-0083023 A 7/2021

* cited by examiner

*Primary Examiner* — Jeff W Natalini
*Assistant Examiner* — Rose Keagy
(74) *Attorney, Agent, or Firm* — Birch, Stewart, Kolasch & Birch, LLP

(57) ABSTRACT

A thin film transistor, and a display apparatus including the thin film transistor are discussed. The thin film transistor includes an active layer and a gate electrode spaced apart from the active layer and overlapping at least part of the active layer. The active layer includes a first oxide semiconductor layer and a second semiconductor layer in contact with the first oxide semiconductor layer and having a lower mobility than that of the first oxide semiconductor layer, and a contact part, which is the part where the first oxide semiconductor layer and the second oxide semiconductor layer are in contact with each other, overlaps the gate electrode.

23 Claims, 11 Drawing Sheets 171     131     150   cont     132     172

131b    131a    cont    132a    132b 131          132

130

171 133 131    150  cont    132      172

TRANSISTOR, AND DISPLAY APPARATUS COMPRISING THE SAME

CROSS-REFERENCE TO RELATED APPLICATIONS

This application claims priority to Korean Patent Application No. 10-2022-0178039 filed in the Republic of Korea on Dec. 19, 2022, which is hereby expressly incorporated by reference into the present application.

BACKGROUND

Technical Field

The present disclosure relates to apparatuses, and particularly to, for example without limitation, a thin film transistor, and a display apparatus including the thin film transistor.

Discussion of the Related Art

Transistors are widely used as switching devices or driving devices in the field of electronic apparatuses.

An oxide constituting an active layer of an oxide semiconductor thin film transistor can be grown at a relatively low temperature, and the oxide semiconductor thin film transistor has a high mobility, and has a large resistance change in accordance with an oxygen content, whereby desired properties can be easily obtained.

Further, in view of the properties of the oxide, since an oxide semiconductor is transparent, it is favorable to embody a transparent display. However, oxide semiconductor thin film transistors can have a disadvantage of having a lower stability and electron mobility than polycrystalline silicon thin film transistors.

Therefore, research is being conducted to compensate for the limitations of oxide semiconductor thin film transistors and polycrystalline silicon thin film transistors and to make the most of each advantage.

The description provided in the background section should not be assumed to be prior art merely because it is mentioned in or associated with the background section. The background section can include information that describes one or more aspects of the subject technology.

SUMMARY OF THE DISCLOSURE

As realized by the inventors, conventionally, since an oxide semiconductor is transparent, it is favorable to embody a transparent display. And the oxide semiconductor thin film transistor has the advantages of growing at a relatively low temperature, having a high mobility, and having a large resistance change in accordance with an oxygen content, whereby desired properties can be easily obtained. However, there can be a limitation in that oxide semiconductor thin film transistors can have a disadvantage of having a lower stability and electron mobility than polycrystalline silicon thin film transistors.

The present disclosure has been made in view of the above issues and it is an object of the present disclosure to provide a thin film transistor that can prevent or at least reduce high drain current stress (HDCS) of the oxide semiconductor layer by mitigating the generation of electric field concentration in the drain region of the oxide semiconductor layer when the thin film transistor is operated.

It is one object of the present disclosure is to provide a thin film transistor that includes an oxide semiconductor layer with a difference in mobility and that can prevent or at least reduce high drain current stress (HDCS) of the oxide semiconductor layer due to electric field concentration.

It is another object of the present disclosure is to provide a display apparatus including such a thin film transistor.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor comprising an active layer and a gate electrode spaced apart from the active layer and overlapping at least part of the active layer. The active layer includes a first oxide semiconductor layer and a second semiconductor layer in contact with the first oxide semiconductor layer and having a lower mobility than that of the first oxide semiconductor layer, and a contact part, which is the part where the first oxide semiconductor layer and the second oxide semiconductor layer are in contact with each other, overlaps the gate electrode.

It is to be understood that both the foregoing general description and the following detailed description are exemplary and explanatory and are intended to provide further explanation of the inventive concepts as claimed.

BRIEF DESCRIPTION OF THE DRAWINGS

The above and other objects, features and other advantages of the present disclosure will be more clearly understood from the following detailed description taken in conjunction with the accompanying drawings, in which.

Figure 1A:
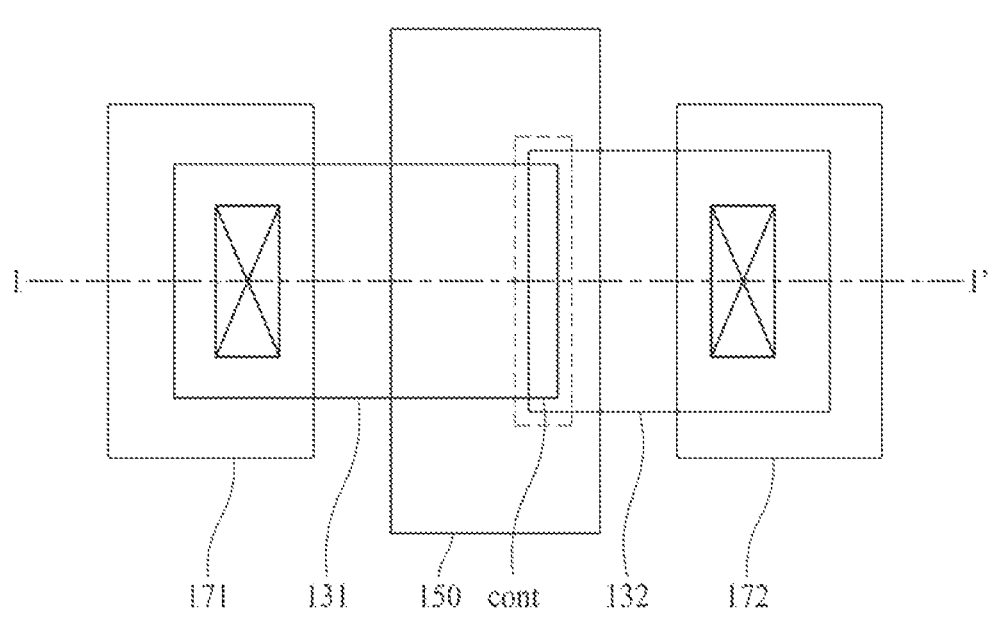
FIG. 1A is a plan view of a thin film transistor according to an exemplary embodiment of the present disclosure.

Throughout the drawings and the detailed description, unless otherwise described, the same drawing reference numerals should be understood to refer to the same elements, features, and structures. The relative size and depiction of these elements can be exaggerated for clarity, illustration, and convenience.

DETAILED DESCRIPTION OF THE EMBODIMENTS

Advantages and features of the present disclosure and implementation methods thereof will be clarified through following exemplary embodiments described with reference to the accompanying drawings. The present disclosure may, however, be embodied in different forms and should not be construed as limited to the exemplary embodiments set forth herein. Rather, these exemplary embodiments are provided so that this disclosure will be thorough and complete and will fully convey the scope of the present disclosure to those skilled in the art. Further, the present disclosure is only defined by scopes of claims.

A shape, a size, area, a ratio, an angle, and a number disclosed in the drawings for describing exemplary embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted, but may be briefly discussed.

In a case where 'comprise', 'have', 'include' 'contain,' 'constitute,' 'make up of,' and 'formed of,' described in the present disclosure are used, another portion can be added unless 'only' is used. The terms of a singular form can include plural forms unless referred to the contrary.

In construing an element, the element is construed as including an error band although there is no explicit description.

In describing a position relationship, for example, when the position relationship is described as 'upon', 'above', 'below' and 'next to', one or more portions can be disposed between two other portions unless 'just' or 'direct' is used.

Spatially relative terms such as "below", "beneath", "lower", "above", and "upper" can be used herein to easily describe a relationship of one element or elements to another element or elements as illustrated in the drawings. It will be understood that these terms are intended to encompass different orientations of the device in addition to the orientation depicted in the drawings. For example, if the device illustrated in the figure is reversed, the device described to be arranged "below", or "beneath" another device can be arranged "above" another device. Therefore, an exemplary term "below or beneath" can include "below or beneath" and "above" orientations. Likewise, an exemplary term "above" or "on" can include "above" and "below or beneath" orientations.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another and may not define any order or sequence. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in a co-dependent relationship.

In the addition of reference numerals to the components of each drawing describing embodiments of the present disclosure, the same components can have the same sign as can be displayed on the other drawings.

In the embodiments of the present disclosure, a source electrode and a drain electrode are distinguished for convenience of description, and the source electrode and the drain electrode can be interchanged. The source electrode can be the drain electrode and vice versa. In addition, the source electrode of any one embodiment can be a drain electrode in another embodiment, and the drain electrode of any one embodiment can be a source electrode in another embodiment.

In some embodiments of the present disclosure, for convenience of description, a source area is distinguished from a source electrode, and a drain area is distinguished from a drain electrode, but embodiments of the present disclosure are not limited thereto. The source area can be the source electrode, and the drain area can be the drain electrode. In addition, the source area can be the drain electrode, and the drain area can be the source electrode.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

A thin film transistor and a display apparatus including one or more of such transistors according to the embodiments of the present disclosure will now be described in more detail. All the components of each thin film transistor and each display apparatus including such thin film transistor according to all embodiments of the present disclosure are operatively coupled and configured.

FIG. 1A is a plan view of a thin film transistor 100 according to an exemplary embodiment of the present disclosure.

Figure 1B:
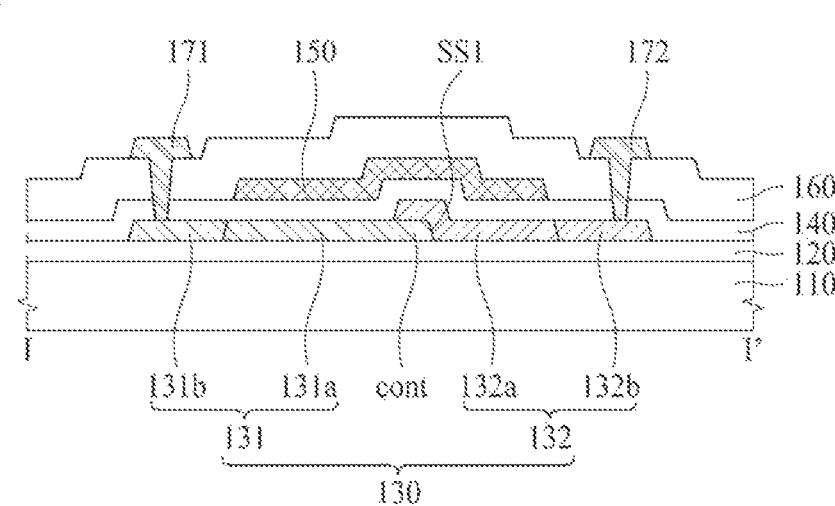
FIG. 1B is a cross-sectional view taken along line I-I' of FIG. 1A.

FIG. 1B is a cross-sectional view taken along line I-I' of FIG. 1A.

Figure 2:
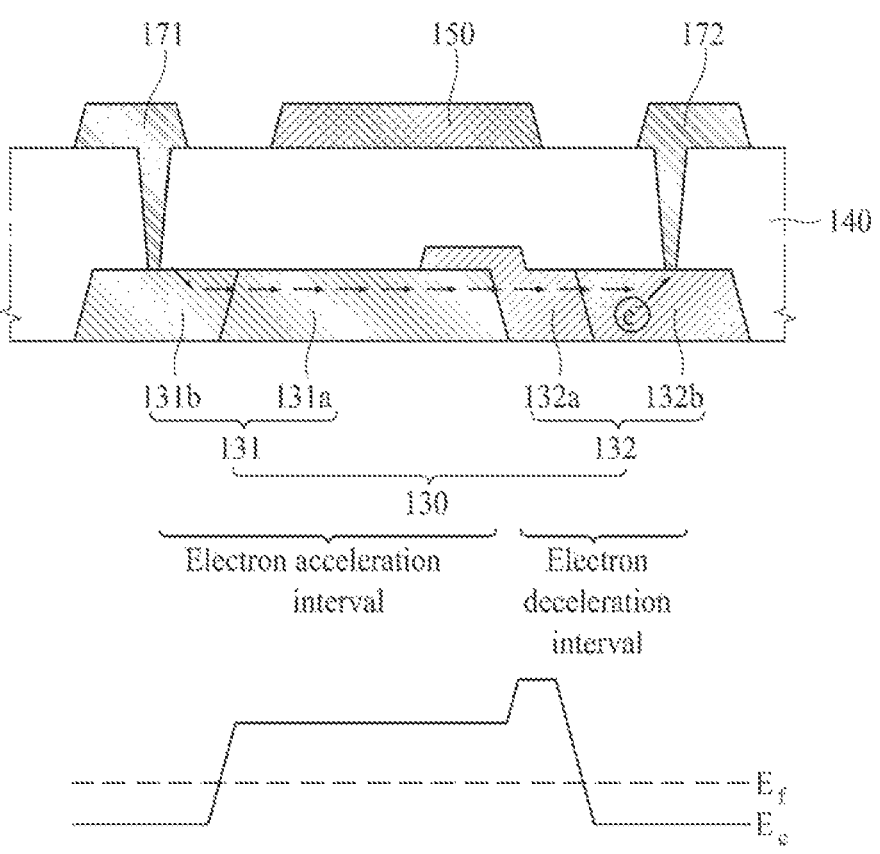
FIG. 2 illustrates a graph of an energy band for each region of an active layer.

FIG. 2 is a graph of an energy band for each region of an active layer.

Referring to FIGS. 1A and 1B, the thin film transistor 100 according to an exemplary embodiment of the present disclosure includes an active layer 130 and a gate electrode 150.

Specifically, referring to FIGS. 1A and 1B, the active layer 130 and the gate electrode 150 on the active layer 130 are included.

The thin film transistor 100 can further include a base substrate 110. Referring to FIG. 1B, the active layer 130 is disposed on the base substrate 110.

The thin film transistor 100 can further include a buffer layer 120. Referring to FIG. 1B, the active layer 130 is disposed on the buffer layer 120. Specifically, the buffer layer 120 is disposed between the base substrate 110 and the active layer 130.

Hereinafter, components of the thin film transistor 100 according to an exemplary embodiment of the present disclosure will be described in more detail.

Glass or plastic can be used as the base substrate 110. Transparent plastic having flexible properties as plastic, for example, polyimide, can be used. According to exemplary embodiments of the present disclosure, the base substrate 110 can include glass, plastic, or a flexible polymer film. For example, the flexible polymer film can be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto.

When polyimide is used as a base substrate 110, heat-resistant polyimide that can withstand high temperatures can be used considering that a high-temperature deposition process is performed on the base substrate 110. In this case, in order to form a thin film transistor, processes such as deposition and etching can be carried out while the polyimide substrate is placed on a carrier substrate made of a high durability material such as glass.

Referring to FIG. 1B, a buffer layer 120 is disposed on the base substrate 110.

The buffer layer 120 can be formed on the base substrate 110 and can be formed of an inorganic material or an organic material to prevent moisture from permeating from the outside. For example, insulating oxides such as silicon oxide (SiOx) and aluminum oxide ($Al_2O_3$) can be included in the buffer layer 120.

The buffer layer (120) can be formed as a single layer or multiple layers to protect the active layer 130, planarize an upper part of the base substrate 110, and block impurities such as moisture and oxygen introduced from the base substrate 110.

According to an exemplary embodiment of the present disclosure, the active layer 130 includes a first oxide semiconductor layer 131 and a second oxide semiconductor layer 132. The second oxide semiconductor layer 132 can be in contact with one side surface SS1 of the first oxide semiconductor layer 131 and can be disposed on the same layer as the first oxide semiconductor layer 131.

Referring to FIG. 1A, the second oxide semiconductor layer 132 can have a width greater than that of the first oxide semiconductor layer 131 in a plan view. However, embodiments of this disclosure are not limited to this, and the first oxide semiconductor layer 131 can have a greater width than the second oxide semiconductor layer 132 or same width as the second oxide semiconductor layer 132. In addition, although the second oxide semiconductor layer 132 is disposed on the first oxide semiconductor layer 131 at overlapped part therebetween, the first oxide semiconductor layer 131 can be formed on the second oxide semiconductor layer 132 at the overlapped part therebetween.

The oxide semiconductor layer 131, 132 can be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor layer 131, 132 can include an oxide semiconductor material. For example, The oxide semiconductor layer 131, 132 can include at least one of IZO (InZnO)-based oxide semiconductor material, IGO (InGaO)-based oxide semiconductor material, ITO (InSnO)-based oxide semiconductor material, IGZO (InGaZnO)-based oxide semiconductor material, IGZTO (InGaZnSnO)-based oxide semiconductor material, GZTO (GaZnSnO)-based oxide semiconductor material, GZO (GaZnO)-based oxide semiconductor material, and GO (GaO)-based oxide semiconductor material and ITZO (InSnZnO)-based oxide semiconductor material. However, embodiments of present disclosure are not limited to this, and the active layer 130 can be made by other oxide semiconductor materials known in the art.

The thin film transistor 100 can further include a gate insulating layer 140.

A gate insulating layer 140 can be disposed on the active layer 130. Specifically, referring to FIG. 1B, the gate insulating layer 140 is disposed between the active layer 130 and the gate electrode 150. According to an exemplary embodiment of the present disclosure, a gate insulating layer 140 can be disposed over the entire upper part of the base substrate 110 including the upper part of the active layer 130. As a result, the active layer 130 and the channel parts 131*a* and 132*a* can be effectively protected by the gate insulating layer 140.

The gate insulating layer 140 can be an inorganic layer for insulating the active layer 130 and the gate electrode 150 from each other, for example include at least one of silicon oxide SiOx, silicon nitride $SiN_x$, and metal oxide. The gate insulating layer 140 can have a single layer structure or a multilayer layer structure, but not limited thereto.

The gate electrode 150 can be disposed on the gate insulating layer 140. The gate electrode 150 can be formed of a conductive material, for example, can include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). The gate electrode 150 can have a multi-layered structure that includes two conductive layers having their respective physical properties different from each other.

The thin film transistor 100 can further include an interlayer insulating layer 160. Specifically, referring to FIG. 1B, an interlayer insulating layer 160 can be disposed on the gate electrode 150.

The interlayer insulating layer 160 is an insulating layer made of an insulating material. Specifically, the interlayer insulating layer 160 can be made of an organic material, an inorganic material, or a laminate of an organic material layer and an inorganic material layer. For example, the interlayer insulating layer 160 can be made of silicon oxide ($SiO_2$) or silicon nitride ($SiN_x$). Alternatively, the interlayer insulating layer 160 can be comprised of a plurality of stacked layers each of which is made of silicon oxide ($SiO_2$) or silicon nitride ($SiN_x$). In particular, the interlayer insulating layer 160 can include a silicon nitride ($SiN_x$) layer containing hydrogen particles.

According to an exemplary embodiment of the present disclosure, the thin film transistor 100 can include a source electrode 171 and a drain electrode 172. The source electrode 171 and the drain electrode 172 can be disposed on the interlayer insulating layer 160 as illustrated in FIG. 1B.

The source electrode 171 and the drain electrode 172 can be spaced apart from each other and electrically connected to the active layer 130, respectively. Referring to FIG. 1B, the source electrode 171 and the drain electrode 172 are connected to a first conductor part 131b and a second conductor part 132b of the active layer 130 through contact holes, respectively.

The source electrode 171 and drain electrode 172 can each contain at least one of molybdenum (Mo), aluminum (Al), chromium (Cr), gold (Au), titanium (Ti), nickel (Ni), neodymium (Nd), copper (Cu), and alloys thereof. Each of the source electrode 171 and the drain electrode 172 can consist of a single layer made of a metal or an alloy of metal, or can consist of two or more multilayers, but the present disclosure is not limited thereto.

According to an exemplary embodiment of the present disclosure, one of the source electrode 171 and the drain electrode 172 can be connected to the first conductor part 131b of the first oxide semiconductor layer 131, and the other can be connected to the second conductor part 132b of the second oxide semiconductor layer 132. Referring to FIGS. 1A and 1B, the source electrode 171 can be connected to the first conductor part 131b of the first oxide semiconductor layer 131, and the drain electrode 172 can be connected to the second conductor part 132b of the second oxide semiconductor layer 132. However, embodiments of this disclosure are not limited to this, and the source electrode 171 can be connected to the second conductor part 132b of the second oxide semiconductor layer 132, and the drain electrode 172 can be connected to the first conductor part 131b of the first oxide semiconductor layer 131.

Hereinafter, the active layer 130 will be described in more detail.

According to an exemplary embodiment of the present disclosure, the first oxide semiconductor layer 131 can include a first channel part 131a and the first conductor part 131b. Specifically, the first channel part 131a overlaps the gate electrode 150, and the first conductor part 131b does not overlap the gate electrode 150. More specifically, the first channel part 131a overlaps a part of the gate electrode 150.

According to an exemplary embodiment of the present disclosure, the second oxide semiconductor layer 132 can include a second channel part 132a and a second conductor part 132b. Specifically, the second channel part 132a overlaps the gate electrode 150, and the second conductor part 132b does not overlap the gate electrode 150. More specifically, the second channel part 132a overlaps a part of the gate electrode 150.

According to an exemplary embodiment of the present disclosure, an area of the first oxide semiconductor layer 131 and the second oxide semiconductor layer 132 overlapping the gate electrode 150 becomes a channel. For example, referring to FIGS. 1A and 1B, the channel part of the thin film transistor 100 is formed by the first channel part 131a, the second channel part 132a, and the contact part (cont).

The first conductor part 131b and the second conductor part 132b can be formed by selective conductorization of an oxide semiconductor layer 131, 132 made of a semiconductor material. According to an exemplary embodiment of the present disclosure, it is called selective conduction to give conductivity to a specific part of the semiconductor layer so as to function as a conductor.

For example, the oxide semiconductor layer 131, 132 can be selectively conductorized by ion doping an intrinsic polycrystalline semiconductor pattern with impurity ions of Group V or Group III, for example, phosphorus (P) or boron (B) at a predetermined concentration. As a result, the first conductor part 131b and the second conductor part 132b can be formed. However, embodiments of this disclosure are not limited to this, and the oxide semiconductor layer 131, 132 can be selectively conductorized by other methods known in the art.

The thin film transistor 100 according to an exemplary embodiment of the present disclosure can include a source electrode 171 and a drain electrode 172 spaced apart from each other and in contact with the first conductor part 131b and the second conductor part 132b. Referring to FIG. 1B, the first conductor part 131b is connected to the source electrode 171 through a first contact hole, and the second conductor part 132b is connected to the drain electrode 172 through a second contact hole, the first contact hole and the second contact hole can be formed to pass through the interlayer insulating layer 160 and gate insulating layer 140. Specifically, through the first conductor part 131b and the second conductor part 132b, the oxide semiconductor layers 131 and 132 can be in electrical contact with the source electrode 171 and the drain electrode 172, respectively.

The first conductor part 131b and the second conductor part 132b have superior electrical conductivity and high mobility compared to the channel parts 131a and 132a. Accordingly, each of the first conductor part 131b and the second conductor part 132b can serve as a wiring.

According to an exemplary embodiment of the present disclosure, at least a part of the first oxide semiconductor layer 131 and at least a part of the second oxide semiconductor layer 132 can overlap the gate electrode 150. Specifically, at least part of the first oxide semiconductor layer 131 and at least part of the second oxide semiconductor layer 132 form channel parts 131a and 132a, and the channel parts 131a and 132a overlap the gate electrode 150.

Referring to FIGS. 1A and 1B, the first oxide semiconductor layer 131 and the second oxide semiconductor layer 132 contact each other to form a contact part cont. Specifically, the first channel part 131a and the second channel part 132a are in contact with each other to form a contact part cont. According to an exemplary embodiment of the present disclosure, the contact part cont, which is the part where the first oxide semiconductor layer 131 and the second oxide semiconductor layer 132 are in contact with each other, overlaps the gate electrode 150.

Referring to FIGS. 1A and 1B, at least a part of the first oxide semiconductor layer 131 and at least a part of the second oxide semiconductor layer 132 overlap each other in the thickness direction of the active layer. Specifically, according to an exemplary embodiment of the present disclosure, at least a part of the first channel part 131a and at least a part of the second channel part 132a overlap each other in the thickness direction of the active layer.

However, embodiments of this disclosure are not limited to this, and the sides of the first oxide semiconductor layer 131 and the second oxide semiconductor layer 132 can contact each other without overlapping the first oxide semiconductor layer 131 and the second oxide semiconductor layer 132. Specifically, according to an exemplary embodiment of the present disclosure, the sides of the first channel part 131a and the sides of the second channel part 132a can contact each other without overlapping.

The voltage applied to the second oxide semiconductor layer 132 connected to the drain electrode 172 can be higher than the voltage applied to the first oxide semiconductor layer 131 connected to the source electrode 171. As a result, the electric field is concentrated on the side of the second oxide semiconductor layer 132 to which a relatively high voltage is applied, and the acceleration of the carrier increases. Therefore, as recognized by the inventor of present disclosure, the carrier with increased acceleration in the drain region has sufficient energy, which can lead to impact ionization. Therefore, HDCS (High Drain Current Stress) occurs in the second oxide semiconductor layer 132 due to the impact ionization phenomenon, increasing the possibility of defects in the active layer 130. In this case, the above HDCS (High Drain Current Stress) refers to the stress that the thin film transistor receives under the condition that the electric field is concentrated in the drain area of the oxide semiconductor layer.

FIG. 2 illustrates a graph of an energy band for each region of an active layer.

Referring to FIG. 2, the vertical axis of the graph represents an energy band, and the horizontal axis sequentially represents a first conductor part 131b, a first channel part 131a, a second channel part 132a, and a second conductor part 132b. The horizontal axis of FIG. 2 can correspond to the distance measured from the left end of the active layer 130.

The oxide semiconductor layers 131, 132 made of oxide semiconductor materials generally have a Fermi level (Ef) adjacent to the conduction band (Ec). When the conduction band (Ec) is formed in an energy part lower than the Fermi level (Ef), electrons can be accelerated. On the other hand, when the conduction band (Ec) is formed in an energy part higher than the Fermi level (Ef), electron deceleration is possible.

Referring to FIG. 2, an electron deceleration section in which electrons are decelerated in the second oxide semiconductor layer 132 is formed, and impact ionization can be prevented or suppressed due to the deceleration of electrons. As a result, the occurrence of HDCS (High Drain Current Stress) in the second oxide semiconductor layer 132 can be prevented or suppressed, and the possibility of defects in the active layer 130 is reduced.

Therefore, it is necessary to lower the mobility of the second oxide semiconductor layer 132 to prevent or suppress the impact ionization phenomenon caused by electric field concentration in the drain area of the second oxide semiconductor layer 132.

According to an exemplary embodiment of the present disclosure, the second oxide semiconductor layer 132 can have a lower mobility than that of the first oxide semiconductor layer 131. Specifically, since the second oxide semiconductor layer 132 has relatively low mobility, the current flow in the on state is not greater than that of the first oxide semiconductor layer 131. Accordingly, electric field concentration in the second oxide semiconductor layer 132 can be alleviated.

According to an exemplary embodiment of the present disclosure, the mobility of the second oxide semiconductor layer 132 is lower than that of the first oxide semiconductor layer 131. More specifically, the first oxide semiconductor layer 131 and the second oxide semiconductor layer 132 can have a mobility difference in the range of 10 to 40 cm$^2$/V·s, or 20 to 30 cm$^2$/V·s, or approximately 25 cm$^2$/V·s. As a result, the electron deceleration effect at the contact part (cont) of the first oxide semiconductor layer 131 and the second oxide semiconductor layer 132 is sufficient, so that the impact ionization phenomenon in the drain region may not occur. Accordingly, deterioration in the drain region can be prevented or at least reduced, and driving stability and reliability of the thin film transistor 100 can be improved.

According to another exemplary embodiment of this disclosure, when the mobility difference between the first oxide semiconductor layer 131 and the second oxide semiconductor layer 132 is greater than approximately 40 cm$^2$/V·s, electron deceleration can be excessive at the interface between the first channel part 131a and the second channel part 132a. As a result, the interface between the first channel part 131a and the second channel part 132a can be damaged, and a defect can occur at the interface between the first channel part 131a and the second channel part 132a. In addition, if the mobility difference between the first oxide semiconductor layer 131 and the second oxide semiconductor layer 132 is greater than approximately 40 cm$^2$/V·s, the amount of current change in the contact part (cont) of the first oxide semiconductor layer 131 and the second oxide semiconductor layer 132 can be very large. As a result, the mobility in the second oxide semiconductor layer 132 is very small, and thus the current flow in the on state can be rapidly lowered. Accordingly, the stability of the active layer 130 can be reduced, and the driving stability and reliability of the thin film transistor 100 can be reduced.

According to an exemplary embodiment of this disclosure, when the mobility difference between the first oxide semiconductor layer 131 and the second oxide semiconductor layer 132 is less than approximately 10 cm$^2$/V·s, the electron deceleration effect in the contact (cont) of the first oxide semiconductor layer 131 and the second oxide semiconductor layer 132 is not sufficiently large. As a result, it can be difficult to prevent deterioration in the drain region. In addition, if the mobility difference between the first oxide semiconductor layer 131 and the second oxide semiconductor layer 132 is less than approximately 10 cm$^2$/V·s, the mobility in the second oxide semiconductor layer 132 is not reduced, so that electric field concentration in the drain region of the second oxide semiconductor layer 132 may not be alleviated or suppressed. As a result, since the deterioration of the active layer 130 is not prevented or at least reduced, the stability of the active layer 130 can be reduced, and the driving stability and reliability of the thin film transistor 100 can be reduced.

According to an exemplary embodiment of the present disclosure, the second oxide semiconductor layer 132 can be made of a material having a lower mobility than the first oxide semiconductor layer 131.

Specifically, the first oxide semiconductor layer 131 can be made of a highly mobile oxide semiconductor material. For example, the first oxide semiconductor layer 131 can include an indium (In)-based or zinc (Zn)-based oxide semiconductor material.

According to an exemplary embodiment of the present disclosure, the first oxide semiconductor layer 131 can include at least one of an IGZO (InGaZnO)-based oxide semiconductor material [Ga concentration<In concentration], an IZO (InZnO)-based oxide semiconductor material, an IGZTO (InGaZnSnO)-based oxide semiconductor material, an ITZO (InSnZnO)-based oxide semiconductor material, an FIZO (FeInZnO)-based oxide semiconductor material, an ZnO-based oxide semiconductor material, an SIZO (SiInZnO)-based oxide semiconductor material, and an ZnON (Zn-Oxynitride)-based oxide-based oxide material.

Gallium Ga can reduce mobility of the oxide semiconductor. Therefore, when the indium (In)-based oxide semiconductor constituting the first oxide semiconductor layer 131 contains gallium (Ga), the content of indium (In) can be set to be higher than the content of gallium (Ga) based on the number of moles.

According to an exemplary embodiment of the present disclosure, the first oxide semiconductor layer 131 can have a mobility in the range of 25 to 50 cm$^2$/V·s. In this exemplary embodiment, the first oxide semiconductor layer 131 can have mobility in the range of 30 to 45 cm$^2$/V·s. In another exemplary embodiment, the first oxide semiconductor layer 131 can have mobility in the range of 35 to 40 cm$^2$/V·s, or approximately 37 cm$^2$/V·s.

The first oxide semiconductor layer 131 including an oxide semiconductor material having high mobility characteristics can have excellent mobility.

On the other hand, the second oxide semiconductor layer 132 can be made of a low mobility oxide semiconductor material. For example, the second oxide semiconductor layer 132 can include a gallium (Ga)-based oxide semiconductor material. The second oxide semiconductor layer 132 including the gallium (Ga)-based oxide semiconductor material has relatively low mobility and can have a stable layer structure.

According to an exemplary embodiment of this disclosure, the second oxide semiconductor layer 132 can include at least one of an IGZO (InGaZnO)-based oxide semiconductor material, a GZO (GaZnO)-based oxide semiconductor material, an IGO (InGaO)-based oxide semiconductor material, and an GZTO (GaZnSnO)-based oxide semiconductor material, wherein Ga concentration in the above materials is equal to or larger than In concentration. However, embodiments of this disclosure are not limited to this, and the second oxide semiconductor layer 132 can be formed by other low-mobility oxide semiconductor materials known in the art.

Among the elements constituting the oxide semiconductor, indium (In) is known as an element that improves mobility of the semiconductor layer or the active layer. Therefore, when the second oxide semiconductor layer 132 includes indium (In), the content of indium (In) can be set to be less than or equal to the content of gallium (Ga) based on the number of moles.

According to another exemplary embodiment of the present disclosure, the second oxide semiconductor layer 132 has a mobility in the range of 10 to 20 cm$^2$/V·s. In this embodiment, the second oxide semiconductor layer 132 can have mobility in the range of 12 to 18 cm$^2$/V·s. More specifically, the second oxide semiconductor layer 132 can have mobility in the range of 13 to 17 cm$^2$/V·s, or approximately 15 cm$^2$/V·s.

Therefore, since the second oxide semiconductor layer 132 has a relatively low mobility, the current flow in the on state is not greater than that of the first oxide semiconductor layer 131. Accordingly, the concentration of the electric field in the second oxide semiconductor layer 132 can be reduced to prevent or at least reduce deterioration of the second oxide semiconductor layer 132. As a result, the driving stability of the thin film transistor 100 can be improved.

According to an exemplary embodiment of this disclosure, the first oxide semiconductor layer 131 can have the same or similar metal composition as the second oxide semiconductor layer 132, and the second oxide semiconductor layer 132 can contact one side surface SS1 of the first oxide semiconductor layer 131.

In the conventional active layer, the oxide semiconductor layer contacts the side of the silicon semiconductor layer to form an interface, but the oxide semiconductor layer and the silicon semiconductor layer have the not identical or not similar metal composition, resulting in a defect at the interface between the oxide semiconductor layer and the silicon semiconductor layer. Specifically, when different materials come into contact, such as an oxide semiconductor layer and a silicon semiconductor layer, defects such as dangling bonds can increase due to differences in binding structure or crystal structure between materials.

On the other hand, the active layer 130 according to an exemplary embodiment of the present disclosure can include a first oxide semiconductor layer 131 and a second oxide semiconductor layer 132 made of the same or similar metal. The first oxide semiconductor layer 131 and the second oxide semiconductor layer 132 have similar binding structures or crystal structures between materials, thereby improving interface properties by the first oxide semiconductor layer 131 and the second oxide semiconductor layer 132, and reducing the possibility of defects in the active layer 130.

In addition, the thin film transistor according to exemplary embodiments of the present disclosure can have a bottom gate structure in which a gate electrode is disposed under the active layer. In another exemplary embodiment, the thin film transistor of the present disclosure can have a dual gate structure having gate electrodes respectively disposed over and under the active layer.

Hereinafter, contents overlapping with FIGS. 1A, 1B, and 2 will be omitted, but may be briefly discussed.

Figure 3:
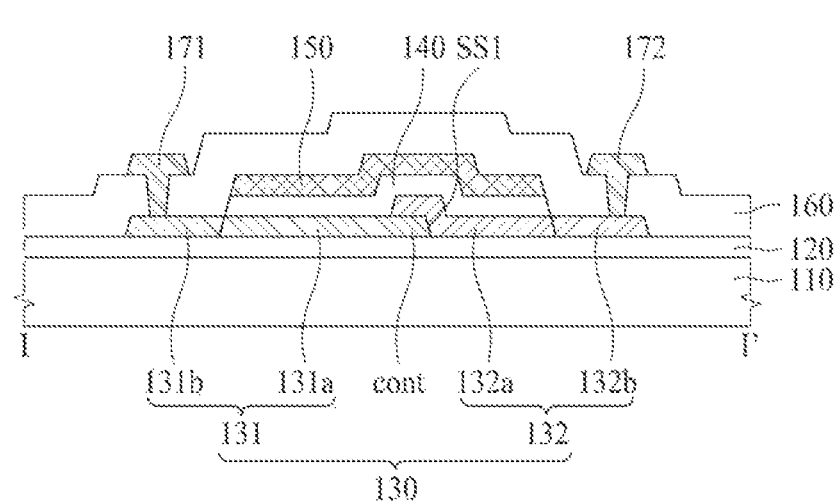
FIG. 3 is a cross-sectional view of a thin film transistor according to another exemplary embodiment of the present disclosure.

FIG. 3 is a cross-sectional view of a thin film transistor 200 according to another exemplary embodiment of the present disclosure.

Referring to FIG. 3, according to an exemplary embodiment of this disclosure, the gate insulating layer 140 can be patterned in various forms to cover the upper surface of the channel parts 131a, 132a of the oxide semiconductor layers 131, 132 and expose the upper surface of the conductor parts 131b, 132b.

Figure 4:
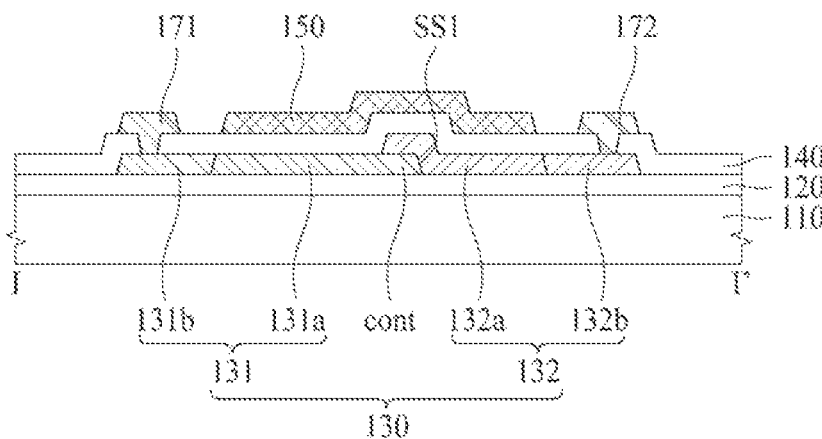
FIG. 4 is a cross-sectional view of a thin film transistor according to still another exemplary embodiment of the present disclosure.

FIG. 4 is a cross-sectional view of a thin film transistor 300 according to still another exemplary embodiment of the present disclosure.

The thin film transistor 300 shown in FIG. 4 does not include an interlayer insulating layer 160 compared to the thin film transistor 100 shown in FIG. 1B.

Specifically, referring to FIG. 4, the source electrode 171 and the drain electrode 172 are disposed on the gate insulating layer 140. The source electrode 171 and the drain electrode 172 can be placed on the same layer as the gate electrode 150, and the source electrode 171 and the drain electrode 172 can be made of the same or similar material as the gate electrode 150 in the same process. The source electrode 171 and the drain electrode 172 are connected to the active layer 130 respectively by a contact hole formed in the gate insulating layer 140.

Figure 5:
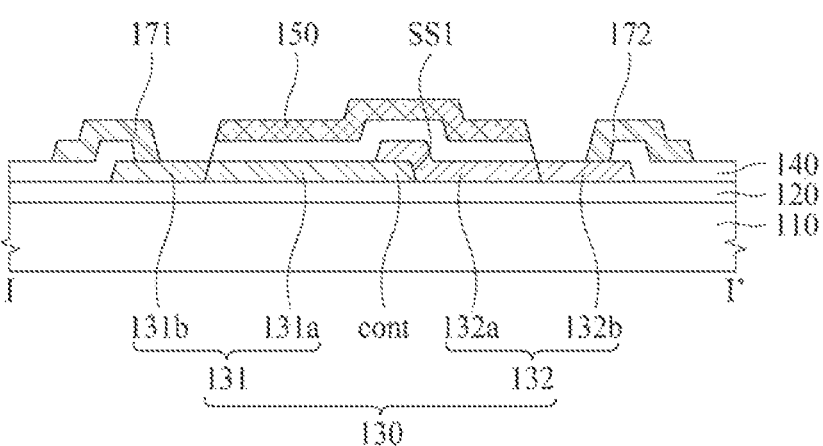
FIG. 5 is a cross-sectional view of a thin film transistor according to still another exemplary embodiment of the present disclosure.

FIG. 5 is a cross-sectional view of a thin film transistor 400 according to still another exemplary embodiment of the present disclosure.

Referring the thin film transistor 400 shown in FIG. 5, compared to the thin film transistor 300 shown in FIG. 4, the gate insulating layer 140 covers the upper surfaces of the channel parts 131*a* and 132*a* of the oxide semiconductor layers 131 and 132 and exposes the upper surfaces of the conductor parts 131*b* and 132*b* of the oxide semiconductor layers 131.

Figure 6:
FIG. 6 is a plan view of a thin film transistor according to still another exemplary embodiment of the present disclosure.
Figure 6:
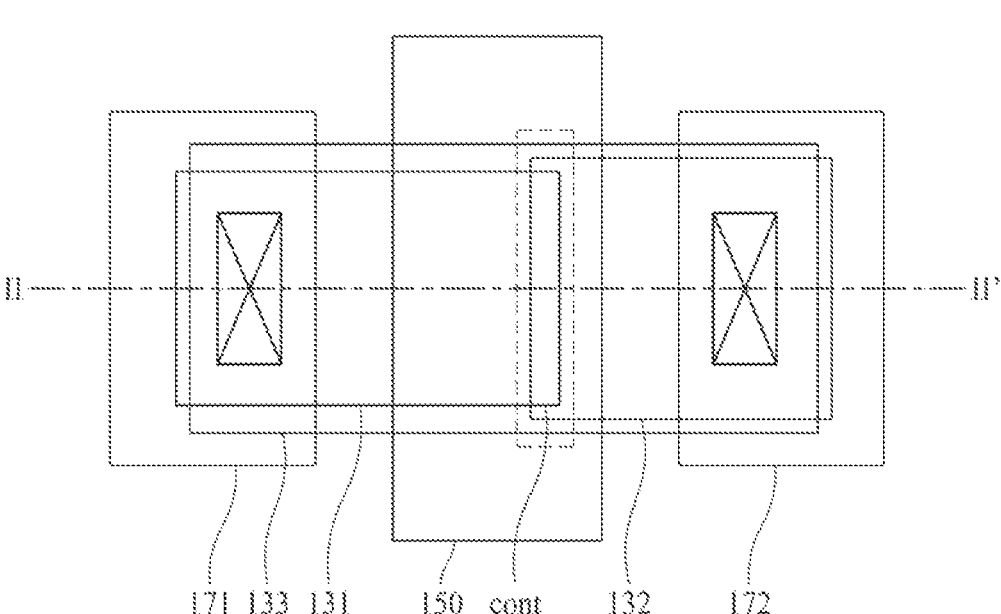
Figure 7:
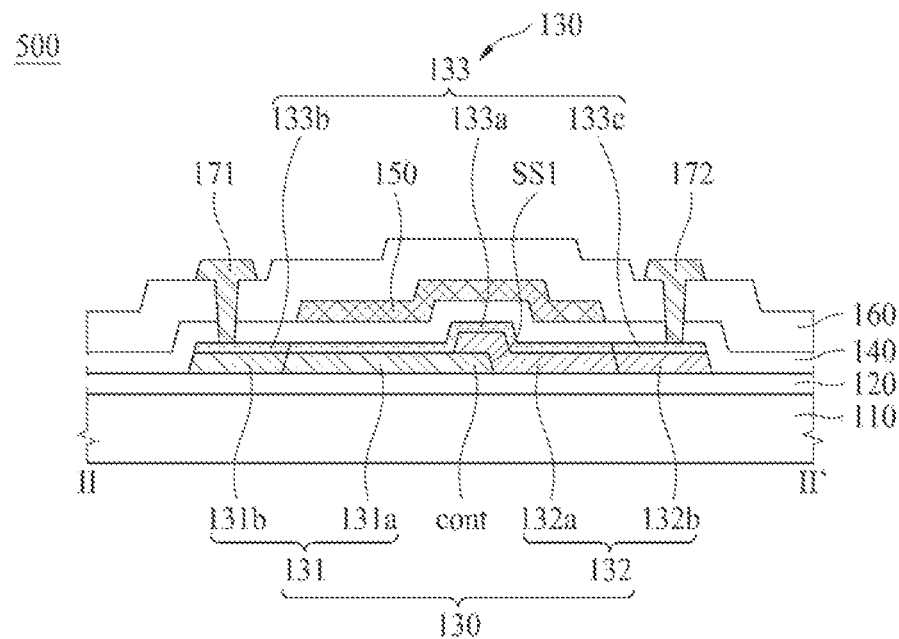
FIG. 7 is a cross-sectional view taken along line II-II' of FIG. 6.

FIG. 6 is a plan view of a thin film transistor 500 according to still another exemplary embodiment of the present disclosure. FIG. 7 is a cross-sectional view taken along line II-II' of FIG. 6.

The thin film transistor 500 illustrated in FIGS. 6 and 7 further includes a third oxide semiconductor layer 133 compared to the thin film transistor 200 illustrated in FIG. 3.

According to an exemplary embodiment of the present disclosure, the third oxide semiconductor layer 133 can be disposed on the first oxide semiconductor layer 131 and the second oxide semiconductor layer 132. Specifically, the third oxide semiconductor layer 133 can overlap the first oxide semiconductor layer 131 and the second oxide semiconductor layer 132 at least in a region overlapping the gate electrode 150. However, embodiments of this disclosure are not limited to this, and the third oxide semiconductor layer 133 can cover the entire upper surface of the first oxide semiconductor layer 131 and the second oxide semiconductor layer 132 except for the contact hole. Alternatively, the third oxide semiconductor layer 133 can cover the entire upper surface of the first oxide semiconductor layer 131 and the second oxide semiconductor layer 132. Referring to FIG. 6, the third oxide semiconductor layer 133 can be larger than the first oxide semiconductor layer 131 and the second oxide semiconductor layer for stable contact in the width direction of the active layer 130. The third oxide semiconductor layer 133 is disposed on the first oxide semiconductor layer 131 and the second oxide semiconductor layer 132 to protect the channel parts 131*a* and 132*a*.

According to an exemplary embodiment of the present disclosure, the third oxide semiconductor layer 133 can at least include a third channel part 133*a* and third conductor parts 133*b* and 133*c*. Specifically, it can include a third channel part 133*a* overlapping the gate electrode 150 and third conductor parts 133*b* and 133*c* that do not overlap the gate electrode 150.

Referring to FIG. 7, the source electrode 171 and the drain electrode 172 can be spaced apart from each other to be electrically in contact with the third conductor parts 133*b* and 133*c*.

According to an exemplary embodiment of the present disclosure, the third oxide semiconductor layer 133 can have a lower mobility than that of the first oxide semiconductor layer 131.

The third oxide semiconductor layer 133 can have the same or similar metal composition as that of the first oxide semiconductor layer 131 and the second oxide semiconductor layer 132. Referring to FIG. 7, the third oxide semiconductor layer 133 can have a thickness thinner than or same as that of the first oxide semiconductor layer 131 and the second oxide semiconductor layer 132.

The third oxide semiconductor layer 133 can be made of a low mobility oxide semiconductor material. For example, the third oxide semiconductor layer 133 can include a gallium (Ga)-based oxide semiconductor material. The third oxide semiconductor layer 133 including the gallium (Ga)-based oxide semiconductor material has relatively low mobility and can have a stable film structure. However, the present disclosure is not limited thereto, as long as the design requirement, in which the third oxide semiconductor layer 133 has relatively low mobility, is satisfied, the oxide semiconductor material can be variously selected.

According to an exemplary embodiment of this disclosure, the third oxide semiconductor layer 133 can include at least one of an IGZO (InGaZnO)-based oxide semiconductor material, a GZO (GaZnO)-based oxide semiconductor material, an IGO (InGaO)-based oxide semiconductor material, and a GZTO (GaZnSnO)-based oxide semiconductor material, wherein Ga concentration in the above materials is equal to or larger than In concentration. However, embodiments of this disclosure are not limited to this, and a third oxide semiconductor layer 133 can be formed by other low-mobility oxide semiconductor materials known in the art.

Among the elements constituting the oxide semiconductor, indium (In) is known as an element that improves mobility of the semiconductor layer or the active layer. Therefore, when the third oxide semiconductor layer 133 includes indium (In), the content of indium (In) can be set to be less than or equal to the content of gallium (Ga) based on the number of moles.

Referring to FIG. 7, the third oxide semiconductor layer 133 is not disposed to increase the carrier concentration or mobility of the active layer 130, but to improve the electrical stability of the active layer 130 and the thin film transistor 500.

Figure 8:
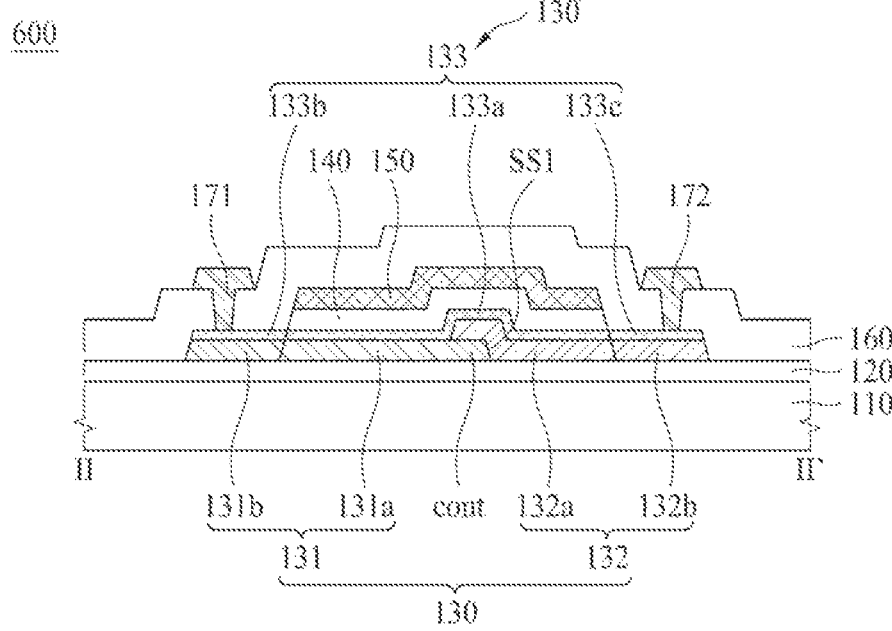
FIG. 8 is a cross-sectional view of a thin film transistor according to still another exemplary embodiment of the present disclosure.

FIG. 8 is a cross-sectional view of a thin film transistor 600 according to still another exemplary embodiment of the present disclosure.

Referring the thin film transistor 600 shown in FIG. 8, compared to the thin film transistor 500 shown in FIG. 7, the gate insulating layer 140 covers the upper surfaces of the channel parts 131*a*, 132*a*, and 133*a* of the oxide semiconductor layer 131, 132, and 133 and exposes the upper surfaces of the third conductor parts 133*b* and 133*c* of the third oxide semiconductor layer 133.

Figure 9:
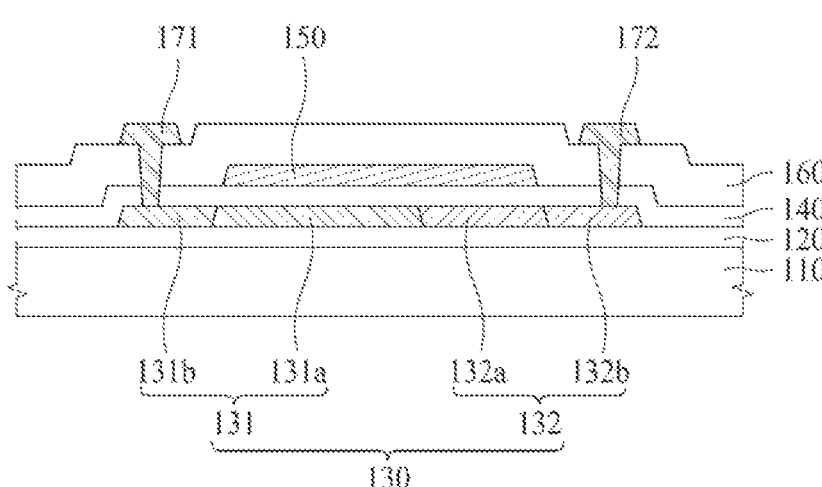
FIG. 9 is a cross-sectional view of a thin film transistor according to still another exemplary embodiment of the present disclosure.

FIG. 9 is a cross-sectional view of a thin film transistor 700 according to still another exemplary embodiment of the present disclosure.

According to an exemplary embodiment of the present disclosure, the first oxide semiconductor layer 131 and the second oxide semiconductor layer 132 may not overlap each other in the thickness direction.

In order to ensure stable contact between the first oxide semiconductor layer 131 and the second oxide semiconductor layer 132 in consideration of process errors, according to an exemplary embodiment of this disclosure, a part of the end of the first oxide semiconductor layer 131 overlaps a part of the second oxide semiconductor layer 132. However, the patterning process of the oxide semiconductor layers 131, 132 can be adjusted very precisely so that the side of the first oxide semiconductor layer 131 and the side of the second oxide semiconductor layer 132 come into contact with each other without overlapping the first oxide semiconductor layer 131 and the second oxide semiconductor layer 132, as shown in FIG. 9. In this case, the first oxide semiconductor layer 131 and the second oxide semiconductor layer 132 are not spaced apart from each other.

Figure 10:
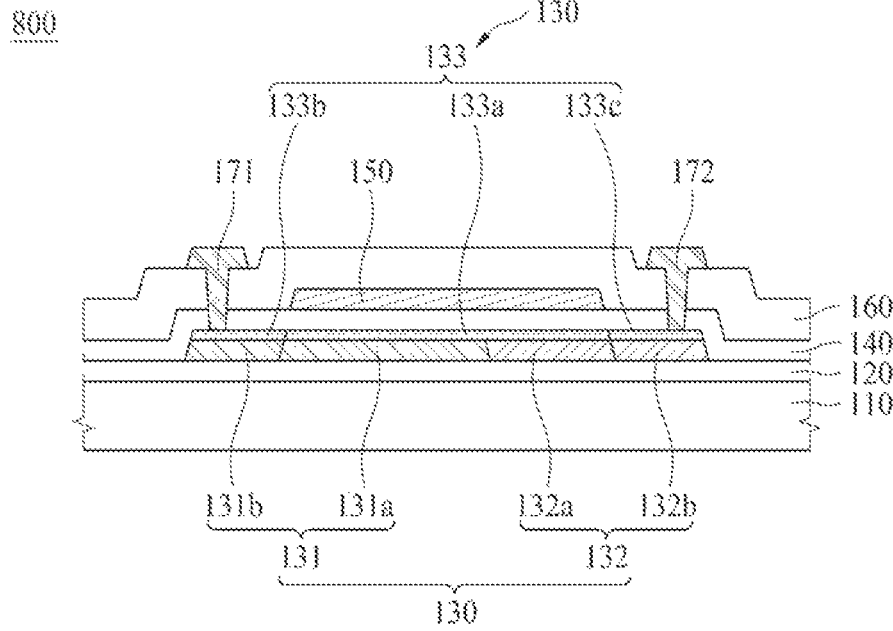
FIG. 10 is a cross-sectional view of a thin film transistor according to still another exemplary embodiment of the present disclosure.

FIG. 10 is a cross-sectional view of a thin film transistor 800 according to still another exemplary embodiment of the present disclosure.

The thin film transistor 800 according to FIG. 10 can further include a third oxide semiconductor layer 133 compared to the thin film transistor 700 according to FIG. 9. In FIG. 10, a configuration in which a third oxide semiconductor layer 133 is disposed on the first oxide semiconductor layer 131 and the second oxide semiconductor layer 132 is illustrated, and the source electrode 171 and the drain electrode 172 can be spaced apart from each other to be electrically in contact with the third conductor parts 133*b* and 133*c*.

Figure 11:
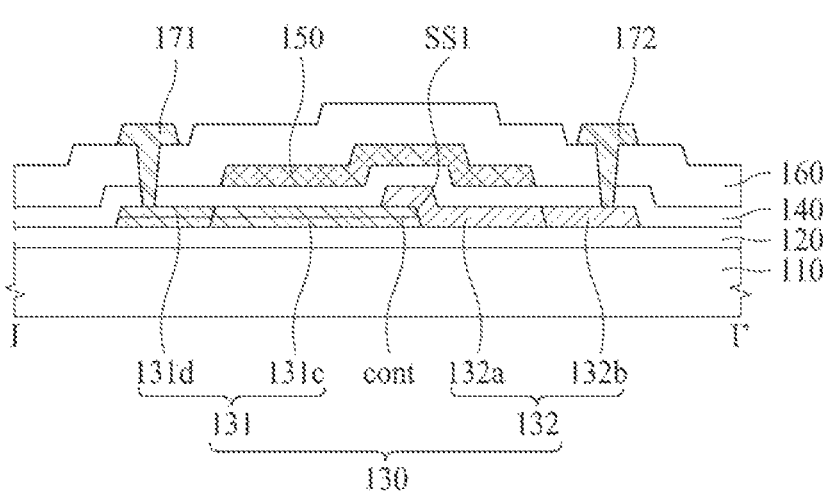
FIG. 11 is a cross-sectional view of a thin film transistor according to still another exemplary embodiment of the present disclosure.

FIG. 11 is a cross-sectional view of a thin film transistor 900 according to still another exemplary embodiment of the present disclosure.

Referring to FIG. 11, the first oxide semiconductor layer 131 of the thin film transistor 900 has a multilayer structure. However, an embodiment of the present disclosure is not limited thereto, and the second oxide semiconductor layer 132 can have a multilayer structure.

According to an exemplary embodiment of the present disclosure, the first oxide semiconductor layer 131 includes a first sub-layer 131*c* and a second sub-layer 131*d* on the first sub-layer 131*c*. According to an exemplary embodiment of the present disclosure, the second sub-layer 131*d* can have a greater mobility than that of the first sub-layer 131*c*. Specifically, the first sub-layer 131*c* can serve as a support layer for supporting the second sub-layer 131*d*, and the second sub-layer 131*d* can mainly serve as a channel layer.

The first sub-layer 131*c* serving as a support layer can have excellent film stability and mechanical stability. The first sub-layer 131*c* can include, for example, at least one of an IGZO (InGaZnO)-based oxide semiconductor material, an IGO (InGaO)-based oxide semiconductor material, an IGTO (InGaSnO)-based oxide semiconductor material, an IGZTO (InGaZnSnO)-based oxide semiconductor material, a GZTO (GaZnSnO)-based oxide semiconductor material, a GZO (GaZnO)-based oxide semiconductor material, and a GO (GaO)-based oxide semiconductor material. However, embodiments of this disclosure are not limited to this, and the first sub-layer 131*c* can be made by other oxide semiconductor materials known in the art.

The second sub-layer 131*d* can be made of, for example, at least one of an IZO (InZnO)-based oxide semiconductor material, an IGO (InGaO)-based oxide semiconductor material, an ITO (InSnO)-based oxide semiconductor material, an IGZO (InGaZnO)-based oxide semiconductor material, an IGZTO (InGaZnSnO)-based oxide semiconductor material, a GZTO (GaZnSnO)-based oxide semiconductor material, and an ITZO (InSnZnO)-based oxide semiconductor material. However, embodiments of this disclosure are not limited to this, and the second sub-layer (131*d*) can be made by other oxide semiconductor materials known in the art.

Figure 12:
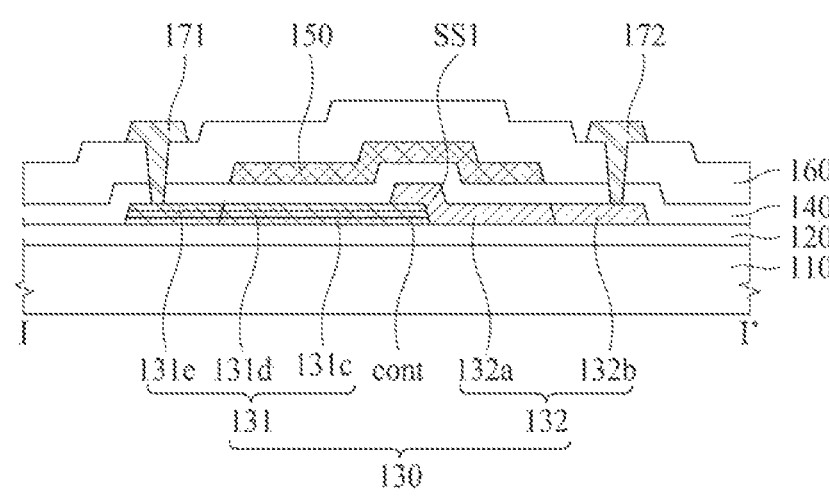
FIG. 12 is a cross-sectional view of a thin film transistor according to still another exemplary embodiment of the present disclosure.

FIG. 12 is a cross-sectional view of a thin film transistor 1000 according to still another exemplary embodiment of the present disclosure.

Referring to FIG. 12, the first oxide semiconductor layer 131 of the thin film transistor 1000 includes a third sub-layer 131*e* on the second sub-layer 131*d*. The third sub-layer 131*e* can have a mobility less than that of the second sub-layer 131*d*. Specifically, the third sub-layer 131*e* can serve as a protective layer for protecting the second sub-layer 131*d*, and the second sub-layer 131*d* can mainly serve as a channel layer.

Figure 13:
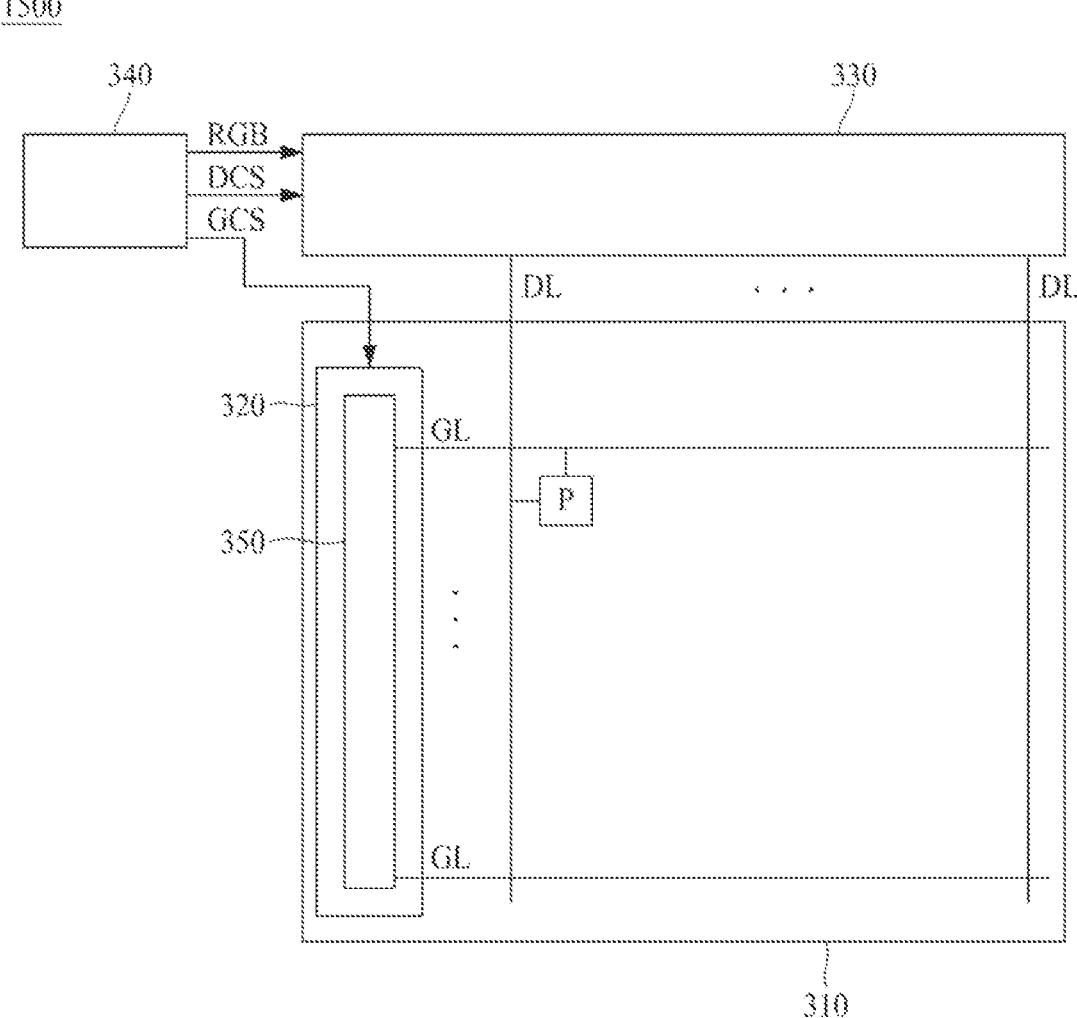
FIG. 13 is a schematic diagram of a display apparatus according to an exemplary embodiment of the present disclosure.

FIG. 13 is a schematic diagram illustrating a display apparatus 1500 according to further still another exemplary embodiment of the present disclosure.

As shown in FIG. 13, the display apparatus 1500 according to further still another exemplary embodiment of the present disclosure can include a display panel 310, a gate driver 320, a data driver 330 and a controller 340. All the components of each display apparatus 1500 according to all embodiments of the present disclosure are operatively coupled and configured.

The display panel 310 includes gate lines GL and data lines DL, and pixels P are disposed in intersection areas of the gate lines GL and the data lines DL and can be disposed in a matrix configuration or other suitable configuration. An image is displayed by driving of the pixels P. The gate lines GL, the data lines DL and the pixels P can be disposed on the base substrate 110.

The controller 340 controls the gate driver 320 and the data driver 330, the gate driver 330 can be directly formed on the substrate 110.

The controller 340 outputs a gate control signal GCS for controlling the gate driver 320 and a data control signal DCS for controlling the data driver 330 by using a signal supplied from an external system. Further, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Further, control signals for controlling a shift register can be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL. Although the data driver 330 is shown as being disposed on one side of the display panel 310 in FIG. 13, the number and position of the data driver 330 are not limited thereto.

According to one exemplary embodiment of the present disclosure, the gate driver 320 can be packaged on the display panel 310. In this way, a structure in which the gate driver 320 is directly packaged on the display panel 310 will be referred to as a Gate In Panel (GIP) structure. In detail, in the Gate In Panel (GIP) structure, the gate driver 320 can be disposed on the base substrate 110. Alternatively, the gate driver 320 can be implemented by a chip-on-film COF method in which an element is mounted on a film connected to the display panel 310.

The display apparatus 1500 according to one exemplary embodiment of the present disclosure can include the above-described thin film transistors 100, 200, 300, 400, 500, 600, 700, 800, 900, and 1000. According to one exemplary embodiment of the present disclosure, the gate driver 320 can include the above-described thin film transistors 100, 200, 300, 400, 500, 600, 700, 800, 900, and 1000.

The gate driver 320 can include a shift register 350, a level shifter, and the like.

The shift register 350 sequentially supplies gate pulses to the gate lines GL for one frame by using the start signal and the gate clock, which are transmitted from the controller 340. In this case, one frame means a time period at which one image is output through the display panel 310. The gate pulse has a turn-on voltage capable of turning on a switching device (thin film transistor) disposed in the pixel P.

Further, the shift register 350 supplies a gate-off signal capable of turning off the switching device, to the gate line GL for the other period of one frame, at which the gate pulse is not supplied. Hereinafter, the gate pulse and the gate-off signal will be collectively referred to as a scan signal SS or Scan.

The shift register 350 can include one or more of the above-described thin film transistors 100, 200, 300, 400, 500, 600, 700, 800, 900, and 1000.

Figure 14:
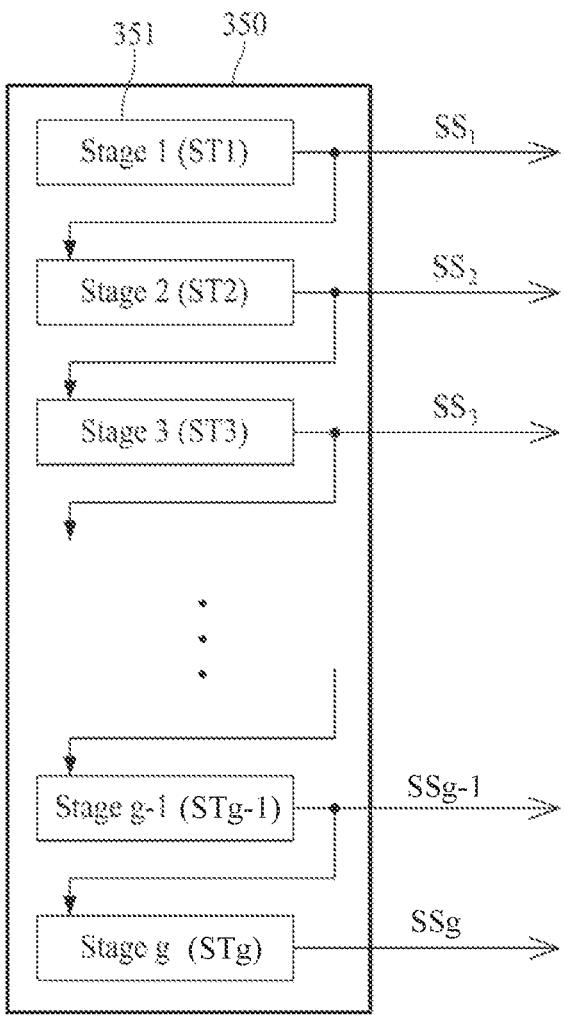
FIG. 14 is a schematic diagram of a shift register usable in the display apparatus of FIG. 13.

FIG. 14 is a schematic diagram illustrating an example of a shift register 350 according to an exemplary embodiment of present disclosure.

Referring to FIG. 14, the shift register 350 can include a 'g' number of stages 351 (ST1 to STg) where g can be a natural number, e.g., a positive integer greater than 1.

The shift register 350 transmits one scan signal SS to pixels P connected to one gate line GL through one gate line GL. Each of the stages 351 can be connected to one gate line GL. When the g number of gate lines GL are formed in the display panel 310, the shift register 350 can include the g number of stages 351 (ST1 to STg), and can generate a g number of scan signals SS1 to SSg.

In general, each stage 351 outputs the gate pulse GP once during one frame, and the gate pulses GP are sequentially output from each stage 351.

Figure 15:
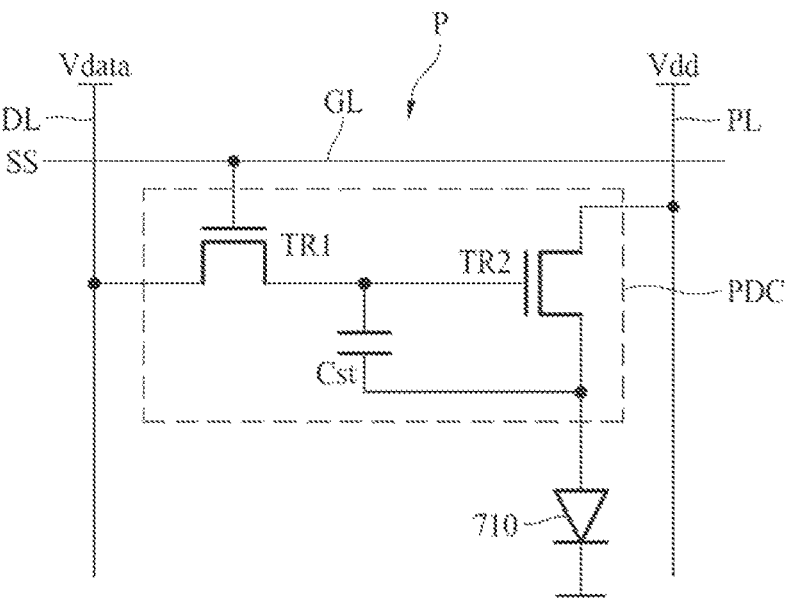
FIG. 15 is a circuit view of one pixel of FIG. 13.

FIG. 15 is a circuit view illustrating any one pixel P of FIG. 13 according to an exemplary embodiment of the present disclosure.

The circuit view of FIG. 15 is an equivalent circuit view for the pixel P of the display apparatus 1500 that includes an organic light emitting diode (OLED) as a display element 710.

Referring to FIG. 15, the pixel P includes a display element 710 and a pixel driving circuit PDC for driving the display element 710. In detail, the display apparatus 1500 according to one exemplary embodiment of the present disclosure can include a pixel driving circuit PDC on the base substrate 110.

The pixel driving circuit PDC of FIG. 15 can include a first thin film transistor TR1 that is a switching transistor and a second thin film transistor TR2 that is a driving transistor. The display apparatus 1500 according to another exemplary embodiment of the present disclosure can include at least one of the above-described thin film transistors 100, 200, 300, 400, 500, 600, 700, 800, 900, and 1000.

The first thin film transistor TR1 includes a gate electrode connected to the gate line GL and a source electrode connected to the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

The driving power line PL provides a driving voltage Vdd to the display element 710, and the first thin film transistor TR1 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode of the second thin film transistor TR2 connected to the display element 710. The data voltage Vdata is charged in a storage capacitor Cst formed between the gate electrode and a source electrode of the second thin film transistor TR2.

The amount of a current supplied to the organic light emitting diode (OLED), which is the display element 710, through the second thin film transistor TR2 is controlled in accordance with the data voltage Vdata, whereby a gray scale of light output from the display element 710 can be controlled.

Figure 16:
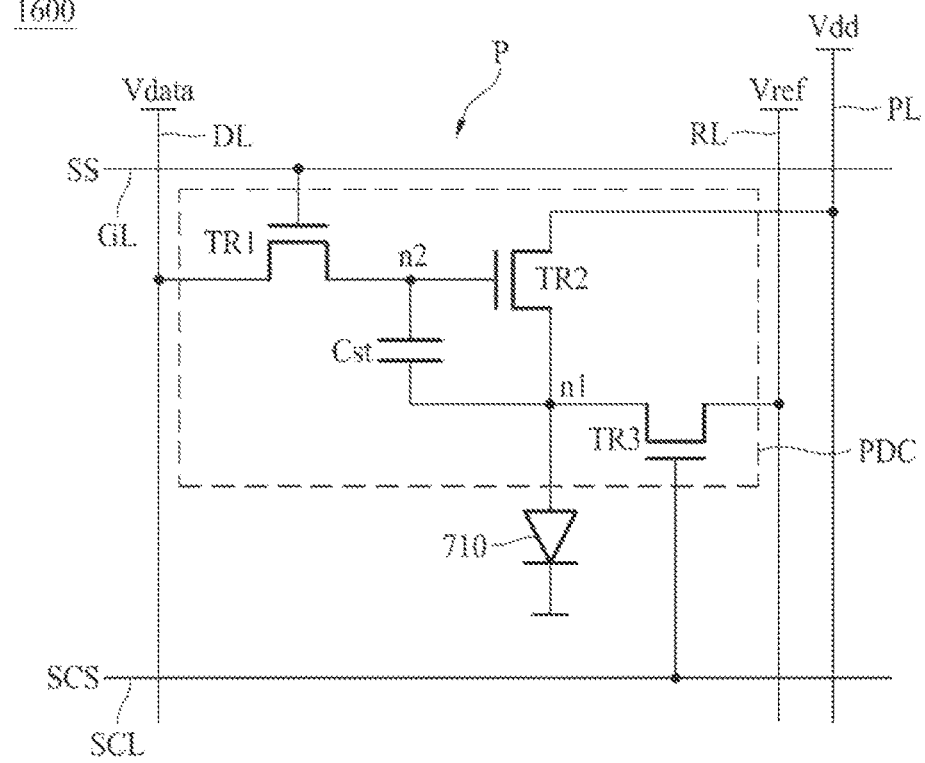
FIG. 16 is a circuit view of any one pixel of a display apparatus according to another exemplary embodiment of the present disclosure.

FIG. 16 is a circuit view illustrating any one pixel P of a display apparatus 1600 according to another exemplary embodiment of the present disclosure. Particularly, FIG. 16 is an equivalent circuit view for the pixel P of an organic light emitting display apparatus.

The pixel P of the display apparatus 1600 shown in FIG. 16 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (sensing transistor) for sensing characteristics of the second thin film transistor TR2. Each of the first thin film transistor TR1 (switching transistor), second thin film transistor TR2 (driving transistor) and third thin film transistor TR3 (sensing transistor) can be embodied as a PMOS transistor which turns on when the gate voltage is at a low level, while each of the first thin film transistor TR1 (switching transistor), second thin film transistor TR2 (driving transistor) and third thin film transistor TR3 (sensing transistor) can be embodied as a NMOS transistor which turns on when the gate voltage is at a high level.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period.

A second node n2 connected with the gate electrode of the second thin film transistor TR2 is connected with the drain electrode of first thin film transistor TR1. A storage capacitor Cst is formed between the second node n2 and the first node n1 (i.e., the gate electrode and source electrode of the second thin film transistor TR2).

When the first thin film transistor TR1 is turned on, the data voltage Vdata supplied through the data line DL is supplied to the gate electrode of the second thin film transistor TR2. The data voltage Vdata is charged in the storage capacitor Cst formed between the gate electrode and the source electrode of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

The display apparatus 1600 according to another exemplary embodiment of the present disclosure can include at least one of the above-described thin film transistors 100, 200, 300, 400, 500, 600, 700, 800, 900, and 1000.

Figure 17:
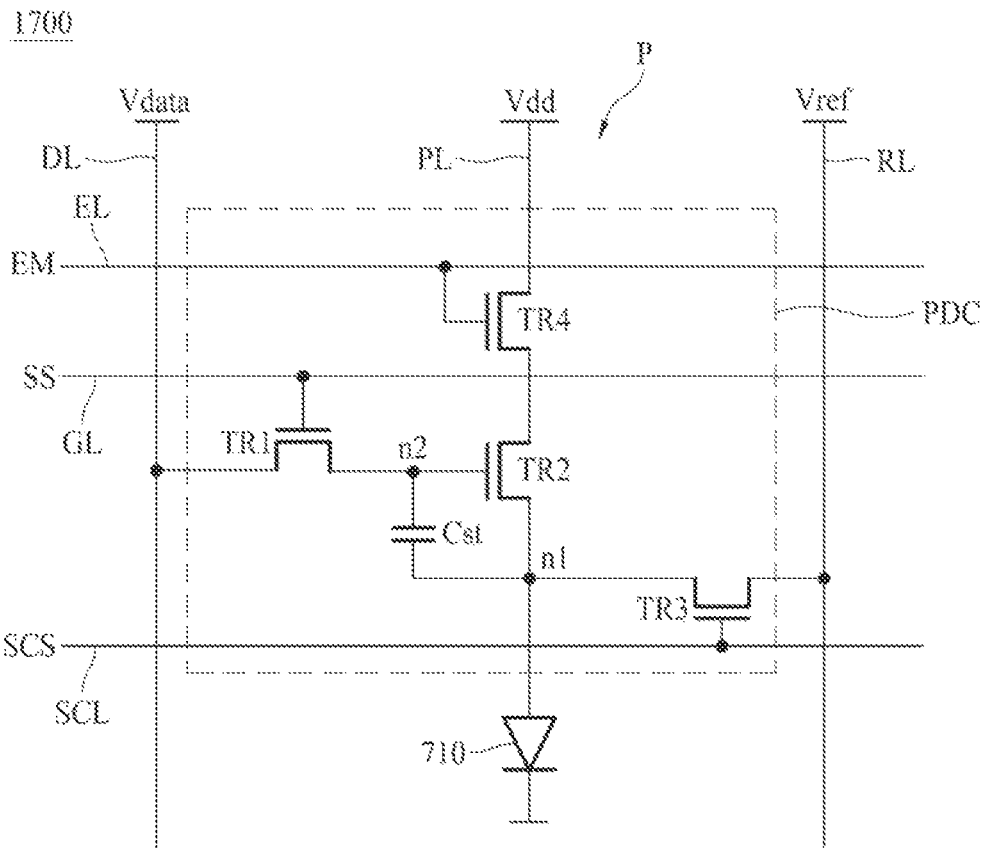
FIG. 17 is a circuit view of any one pixel of a display apparatus according to another exemplary embodiment of the present disclosure.

FIG. 17 is a circuit view illustrating any one pixel P of a display apparatus 1700 according to still another exemplary embodiment of the present disclosure.

The pixel P of the display apparatus 1700 shown in FIG. 17 can include an organic light emitting diode (OLED) that is a display element 710 and a pixel driving circuit PDC for driving the display element 710. The display element 710 is connected with the pixel driving circuit PDC.

The pixel driving circuit PDC can include thin film transistors TR1, TR2, TR3 and TR4. Each of the thin film transistors TR1, TR2, TR3 and TR4 can be embodied as a PMOS transistor which turns on when the gate voltage is at a low level, while each of the thin film transistors TR1, TR2, TR3 and TR4 can be embodied as a NMOS transistor which turns on when the gate voltage is at a high level.

In the pixel P, signal lines DL, EL, GL, PL, SCL and RL for supplying a driving signal to the pixel driving circuit PDC are disposed.

In comparison with the pixel P of FIG. 16, the pixel P of FIG. 17 further includes an emission control line EL. An emission control signal EM is supplied to the emission control line EL. Further, the pixel driving circuit PDC of FIG. 17 further includes a fourth thin film transistor TR4 that is an emission control transistor for controlling a light emission timing of the second thin film transistor TR2, in comparison with the pixel driving circuit PDC of FIG. 16.

The first thin film transistor TR1 is turned on by the scan signal SS supplied to the gate line GL to transmit the data voltage Vdata, which is supplied to the data line DL, to the gate electrode of the second thin film transistor TR2.

A storage capacitor Cst is positioned between the gate electrode of the second thin film transistor TR2 and the anode of display element 710 (i.e., the gate electrode and source electrode of the second thin film transistor TR2).

The third thin film transistor TR3 can include a gate electrode connected to signal line SCL, drain electrode connected to the reference line RL and source electrode connected to node n1, and thus is turned on or off by the sensing control signal SCS applied through signal line SCL and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display element 710.

The pixel driving circuit PDC according to still another exemplary embodiment of the present disclosure can be formed in various structures in addition to the above-described structure. The pixel driving circuit PDC can include, for example, five or more thin film transistors, and a number of storage capacitor can be one or more, for example, the pixel circuit of the present disclosure also can be a 3T2C pixel circuit including three TFTs and two storage capacitors, a 5T1C pixel circuit including five TFTs and one storage capacitor, a 5T2C pixel circuit including five TFTs and two storage capacitors, a 7T2C pixel circuit including seven TFTs and two storage capacitors, or the like.

According to the present disclosure, the following advantageous effects can be obtained.

Since the thin film transistor according to an exemplary embodiment of the present disclosure includes an oxide semiconductor layer having a difference in mobility, the generation of electric field concentration in the drain region of the oxide semiconductor layer is alleviated or prevented. As such electric field concentration is mitigated or prevented, partial damage, deterioration, and HDCS of the oxide semiconductor layer are prevented or at least reduced, thereby improving reliability of the thin film transistor.

The display apparatus according to an exemplary embodiment of the present disclosure including such a thin film transistor can have excellent reliability.

A thin film transistor, according to various embodiments of the present disclosure, can include: an active layer; and a gate electrode spaced apart from the active layer and at least partially overlapped with the active layer; the active layer includes: a first oxide semiconductor layer; and a second oxide semiconductor layer in contact with the first oxide semiconductor layer and having a lower mobility than that of the first oxide semiconductor layer; and a contact part, which is the part where the first oxide semiconductor layer and the second oxide semiconductor layer are in contact with each other, overlaps the gate electrode.

According to some example embodiments of the present disclosure, the first oxide semiconductor layer and the second oxide semiconductor layer can have a mobility difference in the range of 10 to 40 $cm^2/V \cdot s$.

According to some example embodiments of the present disclosure, the first oxide semiconductor layer can have a mobility in the range of 25 to 50 $cm^2/V \cdot s$.

According to some example embodiments of the present disclosure, the second oxide semiconductor layer can have a mobility in the range of 10 to 20 $cm^2/V \cdot s$.

According to some example embodiments of the present disclosure, the first oxide semiconductor layer and the second oxide semiconductor layer can be disposed on the same layer.

According to some example embodiments of the present disclosure, the first oxide semiconductor layer can include: a first channel part overlapping a part of the gate electrode; and a first conductor part that does not overlap the gate electrode. And the second oxide semiconductor layer can include: a second channel part overlapping a part of the gate electrode; and a second conductor part that does not overlap the gate electrode; and the first channel part and the second channel part are in contact with each other.

According to some example embodiments of the present disclosure, the thin film transistor can further include a gate insulating layer between the active layer and the gate electrode. And the gate insulating layer can cover the first and second channel parts and exposes the first and second conductor parts.

According to some example embodiments of the present disclosure, at least a part of the first channel part and at least a part of the second channel part can overlap each other in the thickness direction of the active layer.

According to some example embodiments of the present disclosure, at least a part of the first oxide semiconductor layer can overlap at least a part of the second oxide semiconductor layer in the thickness direction of the active layer.

According to some example embodiments of the present disclosure, the first oxide semiconductor layer and the second oxide semiconductor layer may not overlap each other in the thickness direction of the active layer.

According to some example embodiments of the present disclosure, the thin film transistor can include a source electrode and a drain electrode spaced apart from each other and in contact with the first conductor part and the second conductor part.

According to some example embodiments of the present disclosure, the first oxide semiconductor layer can include at least one of an InGaZnO-based oxide semiconductor material, an InZnO-based oxide semiconductor material, an InGaZnSnO-based oxide semiconductor material, an InSnZnO-based oxide semiconductor material, an FeInZnO-based oxide semiconductor material, an ZnO-based oxide semiconductor material, an SiInZnO-based oxide semiconductor material, and an Zn-Oxynitride-based oxide-based oxide material, wherein in the InGaZnO-based oxide semiconductor material, Ga concentration<In concentration. And the second oxide semiconductor layer can include at least one of an InGaZnO-based oxide semiconductor material, a GaZnO-based oxide semiconductor material, an InGaO-based oxide semiconductor material, and an GaZnSnO-based oxide semiconductor material, wherein in the InGaZnO-based oxide semiconductor material, Ga concentration≥In concentration.

According to some example embodiments of the present disclosure, when the first oxide semiconductor layer includes indium and gallium, the content of indium can be set to be higher than the content of gallium based on the number of moles.

According to some example embodiments of the present disclosure, when the second oxide semiconductor layer includes indium and gallium, the content of indium can be set to be less than or equal to the content of gallium based on the number of moles.

According to some example embodiments of the present disclosure, the first oxide semiconductor layer can include a first sub-layer and a second sub-layer on the first sub-layer.

According to some example embodiments of the present disclosure, the second sub-layer can have a greater mobility than that of the first sub-layer.

According to some example embodiments of the present disclosure, the first oxide semiconductor layer can include a third sub-layer on the second sub-layer.

According to some example embodiments of the present disclosure, the third sub-layer can have a less mobility than that of the second sub-layer.

According to some example embodiments of the present disclosure, the thin film transistor can include a third oxide semiconductor layer disposed on the first oxide semiconductor layer and the second oxide semiconductor layer.

According to some example embodiments of the present disclosure, the third oxide semiconductor layer can be larger than the first oxide semiconductor layer or the second oxide semiconductor layer.

According to some example embodiments of the present disclosure, the third oxide semiconductor layer can overlap an entire of the gate electrode.

According to some example embodiments of the present disclosure, the third oxide semiconductor layer can overlap the first oxide semiconductor layer and the second oxide semiconductor layer in a region overlapping the gate electrode.

According to some example embodiments of the present disclosure, the third oxide semiconductor layer can include at least one of an InGaZnO-based oxide semiconductor material (Ga concentration≥In concentration), a GaZnO-based oxide semiconductor material, an InGaO-based oxide semiconductor material, and a GaZnSnO-based oxide semiconductor material, wherein in the InGaZnO-based oxide semiconductor material, Ga concentration≥In concentration.

According to some example embodiments of the present disclosure, when the third oxide semiconductor layer includes indium and gallium, the content of indium is set to be less than or equal to the content of gallium based on the number of moles.

According to some example embodiments of the present disclosure, the third oxide semiconductor layer can have a lower mobility than that of the first oxide semiconductor layer.

A display apparatus, according to various embodiments of the present disclosure, can include the aforementioned thin film transistor. For instance, the thin film transistors described above can be used in a display panel of the display apparatus or wherever a thin film transistor (e.g., in a pixel) is used in the display apparatus.

A gate driver of the display apparatus, according to various embodiments of the present disclosure, can include the aforementioned thin film transistor.

A shift register (e.g., in a driver of the display apparatus), according to various embodiments of the present disclosure, can include the aforementioned thin film transistor.

It will be apparent to those skilled in the art that the present disclosure described above is not limited by the above-described embodiments and the accompanying drawings and that various substitutions, modifications and variations can be made in the present disclosure without departing from the technical idea or scope of the disclosures. Consequently, the scope of the present disclosure is defined by the accompanying claims, and it is intended that all variations or modifications derived from the meaning, scope and equivalent concept of the claims fall within the scope of the present disclosure.

What is claimed is:

1. A thin film transistor comprising:
a substrate having a main surface, a rear surface opposing the main surface, and a side surface connecting the main surface and the rear surface;
an active layer disposed on the main surface of the substrate; and
a gate electrode spaced apart from the active layer and at least partially overlapped with the active layer in a thickness direction perpendicular to the main surface of the substrate,
wherein the active layer includes:
a first oxide semiconductor layer; and
a second oxide semiconductor layer in contact with a side surface of the first oxide semiconductor layer in a region overlapped by the gate electrode in the thickness direction, and having a mobility lower than a mobility of the first oxide semiconductor layer,
wherein at least a portion of the first oxide semiconductor layer does not overlap the second oxide semiconductor layer in the thickness direction in any region overlapped by the gate electrode in the thickness direction, and
wherein a contact part corresponding to an area where the first oxide semiconductor layer and the second oxide semiconductor layer contact each other, overlaps the gate electrode in the thickness direction.

2. The thin film transistor of claim 1, wherein the first oxide semiconductor layer and the second oxide semiconductor layer have a mobility difference in a range of about 10 to 40 cm$^2$/V·s.

3. The thin film transistor of claim 1, wherein the first oxide semiconductor layer has the mobility in a range of about 25 to 50 cm$^2$/V·s.

4. The thin film transistor of claim 1, wherein the second oxide semiconductor layer has the mobility in a range of about 10 to 20 cm$^2$/V·s.

5. The thin film transistor of claim 1, wherein the first oxide semiconductor layer and the second oxide semiconductor layer are disposed on a same layer.

6. The thin film transistor of claim 1, wherein the first oxide semiconductor layer includes:

a first channel part overlapping a part of the gate electrode in the thickness direction; and a first conductor part that does not overlap the gate electrode in the thickness direction, wherein the second oxide semiconductor layer includes:

a second channel part overlapping a part of the gate electrode in the thickness direction; and a second conductor part that does not overlap the gate electrode in the thickness direction, and wherein the first channel part and the second channel part are in contact with each other.

7. The thin film transistor of claim 6, further comprising a gate insulating layer between the active layer and the gate electrode, wherein the gate insulating layer covers the first and second channel parts and exposes the first and second conductor parts.

8. The thin film transistor of claim 6, wherein at least a part of the first channel part and at least a part of the second channel part overlap each other in the thickness direction.

9. The thin film transistor of claim 6, further comprising a source electrode and a drain electrode spaced apart from each other and in contact with the first conductor part and the second conductor part respectively.

10. The thin film transistor of claim 1, wherein at least a part of the first oxide semiconductor layer overlaps at least a part of the second oxide semiconductor layer in the thickness direction.

11. The thin film transistor of claim 1, wherein the first oxide semiconductor layer and the second oxide semiconductor layer do not overlap each other in the thickness direction.

12. The thin film transistor of claim 1, wherein the first oxide semiconductor layer includes at least one of an InGaZnO-based oxide semiconductor material, an InZnO-based oxide semiconductor material, an InGaZnSnO-based oxide semiconductor material, an InSnZnO-based oxide semiconductor material, an FeInZnO-based oxide semiconductor material, an ZnO-based oxide semiconductor material, an SiInZnO-based oxide semiconductor material, and an Zn-Oxynitride-based oxide-based oxide material, wherein in the InGaZnO-based oxide semiconductor material, Ga concentration <In concentration based on the number of moles, and wherein the second oxide semiconductor layer includes at least one of an InGaZnO-based oxide semiconductor material, a GaZnO-based oxide semiconductor material, an InGaO-based oxide semiconductor material, and an GaZnSnO-based oxide semiconductor material, wherein in the InGaZnO-based oxide semiconductor material, Ga concentration≥In concentration based on the number of moles.

13. The thin film transistor of claim 1, wherein the first oxide semiconductor layer includes a first sub-layer and a second sub-layer on the first sub-layer.

14. The thin film transistor of claim 13, wherein the second sub-layer has a greater mobility than that of the first sub-layer.

15. The thin film transistor of claim 13, wherein the first oxide semiconductor layer further includes a third sub-layer on the second sub-layer.

16. The thin film transistor of claim 15, wherein the third sub-layer has a mobility lower than a mobility of the second sub-layer.

17. The thin film transistor of claim 1, further comprising a third oxide semiconductor layer disposed on the first oxide semiconductor layer and the second oxide semiconductor layer.

18. The thin film transistor of claim 17, wherein the third oxide semiconductor layer is larger than the first oxide semiconductor layer or the second oxide semiconductor layer.

19. The thin film transistor of claim 17, wherein the third oxide semiconductor layer overlaps the entire gate electrode in the thickness direction.

20. The thin film transistor of claim 17, wherein the third oxide semiconductor layer overlaps the first oxide semiconductor layer and the second oxide semiconductor layer in the thickness direction in a region overlapping the gate electrode in the thickness direction.

21. The thin film transistor of claim 17, wherein the third oxide semiconductor layer includes at least one of an InGaZnO-based oxide semiconductor material (Ga concentration ≥In concentration), a GaZnO-based oxide semiconductor material, an InGaO-based oxide semiconductor material, and a GaZnSnO-based oxide semiconductor material, wherein in the InGaZnO-based oxide semiconductor material, Ga concentration≥In concentration based on the number of moles.

22. The thin film transistor of claim 17, wherein the third oxide semiconductor layer has a mobility lower than the mobility of the first oxide semiconductor layer.

23. A display apparatus comprising:

a display panel configured to display images; and at least one driver configured to drive the display panel, wherein at least one of the display panel and the at least one driver includes the thin film transistor of claim 1.

* * * * *